United States Patent [19]

Rand

[11] Patent Number: 4,647,330
[45] Date of Patent: Mar. 3, 1987

[54] HYBRID SINGLE CRYSTAL OPTIC FIBERS BY GROWTH SOLUTION

[75] Inventor: Stephen C. Rand, Agoura, Calif.

[73] Assignee: The United States of America as represented by the Secretary of the Air Force, Washington, D.C.

[21] Appl. No.: 782,335

[22] Filed: Oct. 1, 1985

[51] Int. Cl.$^4$ ............................ C30B 7/00; C30B 9/00
[52] U.S. Cl. .................................. 156/621; 156/624; 156/DIG. 112; 350/96.1
[58] Field of Search ............. 156/624, 621, DIG. 112; 350/96.1

[56] References Cited

U.S. PATENT DOCUMENTS

| | | | |
|---|---|---|---|
| 3,802,760 | 4/1974 | Sosnowski | 350/96 WG |
| 3,830,558 | 8/1974 | Deserno et al. | 350/160 |
| 3,895,242 | 7/1975 | Yoshida | 307/88.3 |
| 4,128,299 | 12/1978 | Maher | 350/96.13 |

OTHER PUBLICATIONS

Chraplyvy, A. R. et al., "Infrared Generation by Means of Multiple-Order Stimulated Raman Scattering in CCl$_4$-and CBrCl$_3$-Filled Hollow Silica Fibers," *Optics Letters*, vol. 6, No. 12, Dec. 1981, pp. 632–633.
Hewig, G. H. et al., "Frequency Doubling in a LiNbO$_3$ Thin Film Deposited on Sapphire," *J. Appl. Phys.*, 54, (1), Jan. 1983, pp. 57–61.
Stolen, Roger H. et al., "Parametric Amplification and Frequency Conversion in Optical Fibers," *IEEE Journal of Quantum Electronics*, vol. QE-18, No. 7, Jul. 1982, pp. 1062–1072.
Koester, Charles J., "9A 4–Laser Action by Enhanced Total Internal Reflection," *IEEE Journal of Quantum Electronics*, vol. QE-2, No. 9, Sep. 1966, pp. 580–584.
Koester, Charles J. et al., "Amplification in a Fiber Laser," *Applied Optics*, vol. 3, No. 10, Oct. 1964, pp. 1182–1186.

*Primary Examiner*—John Doll
*Assistant Examiner*—Lori S. Freeman
*Attorney, Agent, or Firm*—Stanton E. Collier; Donald J. Singer

[57] ABSTRACT

A process of fabricating a hybrid single crystal fiber having nonlinear optical properties such as frequency doubling. Said process includes placing a fiber core upon a bulk nonlinear crystal such as LiIO$_3$ in a saturated growth solution of LiIO$_3$ in water. After the core is encased a sufficient distance crystal growth is stopped.

9 Claims, 1 Drawing Figure

U.S. Patent   Mar. 3, 1987   4,647,330
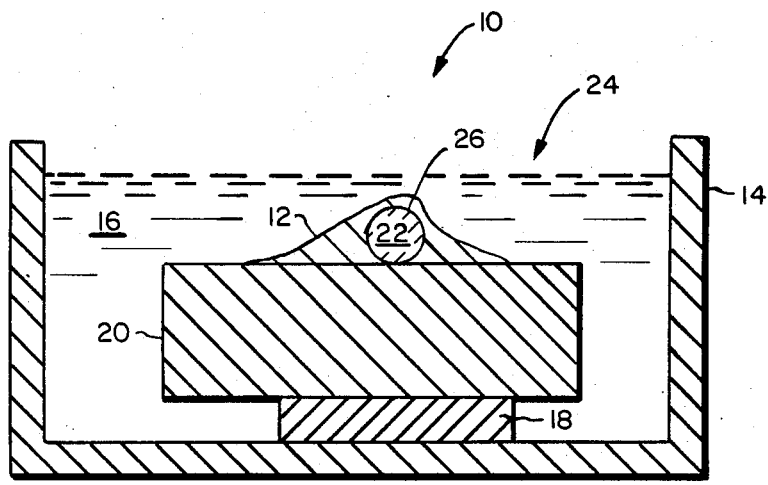

HYBRID SINGLE CRYSTAL OPTIC FIBERS BY GROWTH SOLUTION

STATEMENT OF GOVERNMENT INTEREST

The invention described herein may be manufactured and used by or for the Government for governmental purposes without the payment of any royalty thereon.

BACKGROUND OF THE INVENTION

This invention relates generally to glass fiber optics, and particularly, relates to a process of fabricating fibers useful in nonlinear optics applications.

Previous nonlinear optical fibers have relied on 4-wave mixing in glass fibers, doping of glass fiber claddings, or cores, or liquid core fibers. Phase-matched 3-wave mixing (frequency doubling, summation or difference generation an parametric amplification) has never been achieved in glass fibers. Although planar waveguides have been used for frequency doubling, their efficiency is limited by short interaction length and high losses coupling into and out of such structures. Also, the use of planar guides in certain fiber optic systms is restricted by differences in the guide shapes themselves corresponding to differences in their mode structures.

For example, in conventional fiber optics, light is guided by total internal reflection in a filament of glass having a glass cladding of lower index fused on the light-carrying core to provide a good interface at which reflection occurs. When a doped cladding is applied to a passive core, and the cladding has a lower index, a small portion of the light penetrates into the lower index cladding in the form of an evanescent wave. Depending on the type of cladding, oscillations and amplification of the input light signal may occur.

Frequency doubling has been obtained in planar optical waveguides using nonlinear interactions therein. For example, a thin film of LiNbO$_3$ was rf-sputtered onto a sapphire substrate. Tunable laser radiation was coupled into this guide and phase-matched frequency up-conversion was obtained with an efficiency of about $10^{-3}$. The problem associated with this method was that there is a short interaction length. The use of planar waveguides in fiber optics systems is unlikely because of the short interaction distance and the problems associated therewith.

The present invention is directed toward providing a process of fabricating hybrid single crystal optical fibers for frequency conversion and amplification in which the above undesirable characteristics are minimized.

SUMMARY OF THE INVENTION

The instant invention set forth a process of fabricating hybrid single crystal optical fibers having nonlinear optical properties therein and thereby overcome the problems set forth hereinabove.

In this process, a fiber core is placed in direct contact with a bulk nonlinear crystal having an essentially flat surface thereon. The fiber core and bulk nonlinear crystal are immersed in a saturated growth solution for the bulk nonlinear crystal. Crystal growth occurs on the bulk nonlinear crystal and about the fiber core encasing it thereon.

Because of evanescent wave coupling between modes guided by the fiber, whose index of refraction exceeds that of the bulk nonlinear crystal, nonlinear optical polarizations can be generated in the nonlinear optical crystal which radiates new frequencies back into the guided modes. The fiber thereby acquires controllable nonlinear optical properties which glass fibers do not possess.

One object of the present invention is a process to fabricate hybrid single crystal optical fibers.

Another object of the present invention is a process whereby a fiber core is covered over a substantial length and surface area by a bulk nonlinear crystal.

Another object of the present invention is a process of fabricating hybrid single crystal optical fibers for frequency conversion such as doubling.

Another object of the present invention is a process of fabricating hybrid single crystal optical fibers for light amplification by parametric mixing.

These and many other objects and advantages of the present invention will be readily apparent to one skilled in the pertinent art from the following detailed description of a preferred embodiment of the invention and the related drawings.

BRIEF DESCRIPTION OF THE DRAWINGS

The only FIGURE of the present invention is a cross-section of the apparatus used to carry out the process of the present invention.

DETAILED DESCRIPTION OF THE PREFERRED EMBODIMENT

Referring to the only FIGURE, an apparatus 10 for fabricating a hybrid single crystal fiber 24 is shown in cross section. Hybrid single crystal fiber 24 comprises an optical fiber core 22 being glass, for example, and a bulk nonlinear crystal 20 intimately joined by crystal growth in a manner to be described.

Bulk nonlinear crystal 20 rests in a container 14 on a support 18. Fiber core 22 and bulk nonlinear crystal 20 are immersed in super saturated growth solution 16 for growing crystal 20. After a sufficient time and at a selected temperature, a growth cladding 12 will encase fiber core 22. Clearly multiple fiber cores 22 can be encased in this manner for the simple purpose of multiplicity or for coupling different fibers or for coupling a given fiber to itself at several different spatial locations.

Growth solution 16 is a typical crystal growth solution having a supersaturation of the crystallizing component therein which in this case is the same as bulk nonlinear crystal 20. Crystal 20 provides the orientation of the growth and thus by orienting fiber core 22 thereon one is able to select how fiber core 22 is oriented with respect to crystal 20. By selectively adjusting supersaturation and temperature, growth cladding 12 is grown about core 22 for any desired length. Also the addition of doping material to growth solution 16 may allow further useful features.

Hybrid single crystal fiber 24 is fabricated by placing an unclad 125 micron silica fiber 22 in contact with a LiIO$_3$ bulk nonlinear crystal 20 in a supersaturated growth solution 16 of LiIO$_3$ in water. Other ionic solids are ammonium dihydrogen phosphate (ADP) and potassium dihydrogen phosphate (KDP). The growth occurred at room temperature, at about 70° F. for a period of time sufficient to encase fiber core 22 over a distance of about one centimeter and resulted in fiber 22 being encased to form hybrid single crystal fiber 24. Microscopic examination of hybrid single crystal fiber 24 indicated excellent optical contact with no polycrystalline material at fiber/crystal interface 26.

In general, the process of fabricating hybrid single crystal fibers comprises the step of:

placing a bulk nonlinear crystal in a container for holding a growth solution, said bulk nonlinear crystal having a substantially flat upper surface;

placing at least one fiber core on said surface of said bulk nonlinear crystal;

holding said fiber core upon said upper surface;

filling said container with a growth solution, said solution covering said fiber core;

heating said solution; and allowing crystal growth to encase said fiber care in a controlled manner.

The above process yields oriented fibers in virtually any ionic solid grown from solution. Because of evanescent wave coupling between modes guided by fibers 24, whose index of refraction exceeds that of crystal 20, nonlinear optical polarization can be generated in the nonlinear optical crystal growth cladding 12 which radiates new frequencies back into the guided mode. The fiber 24 thereby acquires controllable nonlinear optical properties.

Because of the above nonlinear optical properties, hybrid single crystal fibers 24 can be used in frequency conversion and amplification. Weak, coherent light sources can be doubled in frequency, summed, or differenced, and parametric process can convert guided light into new frequencies and amplify. These fibers 24 are thus useful in fiber-optic systems for communications, fiber gyroscopes, fiber taps, and sensors.

Clearly, many modifications and variations of the present invention are possible in light of the above teachings and it is therefore understood, that within the inventive scope of the inventive concept, the invention may be practiced otherwise than specifically claimed.

What is claimed is:

1. A process of fabricating hybrid single crystal fibers, said process comprising the steps of:

placing a bulk nonlinear crystal in a container for holding a growth solution, said bulk nonlinear crystal having a substantially flat upper surface;

placing at least one fiber core on said surface of said bulk nonlinear crystal;

holding said fiber core upon said upper surface;

filling said container with a growth solution, said solution covering said fiber core;

heating said solution; and allowing crystal growth to encase said fiber core.

2. A process as defined in claim 1 wherein said bulk nonlinear crystal is an ionic solid capable of crystal growth.

3. A process as defined in claim 2 wherein said ionic solid is selected from the group consisting of $LiIO_3$, $NH_4H_2PO_4$ and $KH_2PO_4$.

4. A process as defined in claim 2 wherein said growth solution comprises an ionic compound with water.

5. A process as defined in claim 4 wherein said solution is saturated.

6. A process as defined in claim 1 wherein said heating is at a temperature of about 70° F.

7. A process as defined in claim 1 wherein said fiber core is totally encased on said crystal by crystal growth thereon.

8. A process as defined in claim 4 wherein said ionic compound is essentially that of said bulk nonlinear crystal.

9. A process as defined in claim 5 wherein said solution is supersaturated.

* * * * *